United States Patent [19]

Southerland, Jr.

[11] Patent Number: 4,496,851

[45] Date of Patent: Jan. 29, 1985

[54] DYNAMIC METAL OXIDE SEMICONDUCTOR FIELD EFFECT TRANSISTOR CLOCKING CIRCUIT

[75] Inventor: Ebbin R. Southerland, Jr., Houston, Tex.

[73] Assignee: Texas Instruments Incorporated, Dallas, Tex.

[21] Appl. No.: 353,294

[22] Filed: Mar. 1, 1982

[51] Int. Cl.³ .................. H03K 19/096; H03K 19/20; H03K 17/693

[52] U.S. Cl. ..................... 307/269; 307/453; 307/481; 307/582; 307/583

[58] Field of Search ............... 307/453, 481, 577, 582, 307/583, 584, 269

[56] References Cited

U.S. PATENT DOCUMENTS

| | | | |
|---|---|---|---|
| 3,567,968 | 3/1971 | Booher | 307/577 |
| 4,291,247 | 9/1981 | Cooper, Jr. et al. | 307/481 |
| 4,317,180 | 2/1982 | Lies | 307/481 X |
| 4,415,819 | 11/1983 | Mathes | 307/453 X |

Primary Examiner—Stanley D. Miller
Assistant Examiner—David R. Hudspeth
Attorney, Agent, or Firm—Thomas E. Tyson; Leo N. Heiting; Melvin Sharp

[57] ABSTRACT

A dynamic metal oxide field effect transistor clocking circuit provides at least one output at a fixed time interval after receiving an input. This clocking circuit includes a first stage which further includes a node connected to the first stage output and circuit capability to charge the node and conditionally discharge the node upon receiving an input. A second stage is connected to the first stage so that the output of the first stage provides the second stage input. The second stage also consists of a node that is charged by circuitry in the second stage and is conditionally discharged upon the occurrence of the input received from the first stage. The second stage includes the capability to block the discharge of the second stage when the first stage discharges without the requirement of a second discharge clock.

5 Claims, 7 Drawing Figures

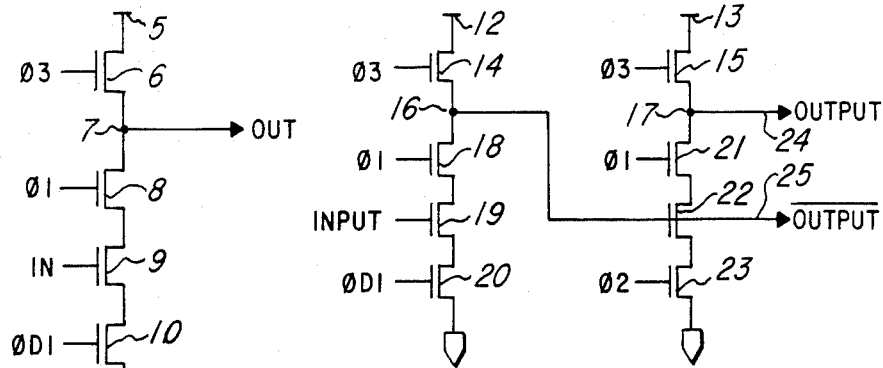
Fig.1 PRIOR ART
Fig.2 PRIOR ART
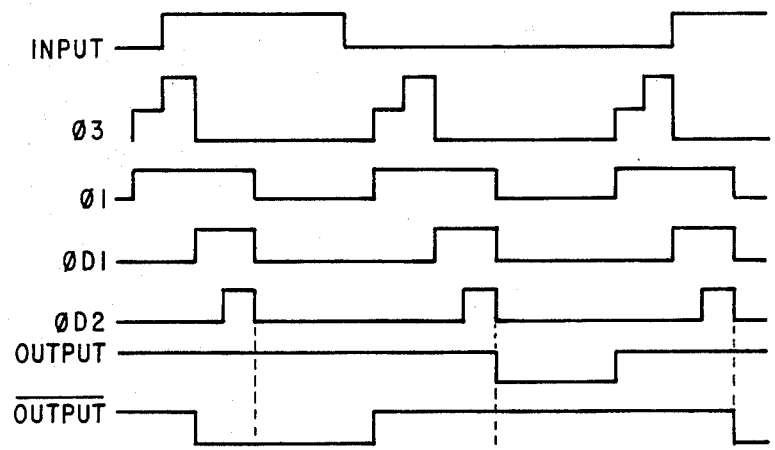
Fig.3
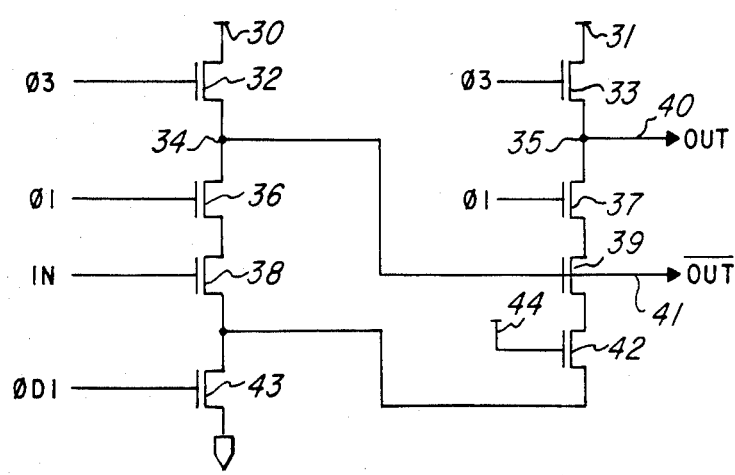
Fig.4

DYNAMIC METAL OXIDE SEMICONDUCTOR FIELD EFFECT TRANSISTOR CLOCKING CIRCUIT

BACKGROUND OF THE INVENTION

1. Field of the Invention

This invention relates to metal oxide semiconductor field effect transistor circuits and more particularly to metal oxide semiconductor field effect clocking circuits.

2. Description of the Prior Art

Dynamic clocking circuitry have been implemented in N-channel metal oxide semiconductor field effect transistors as shown in FIG. 1. This circuit is a simple inverter dynamic circuit that requires a node to be charged and then conditionally discharged on the existence of an input. One requirement of the dynamic circuits is the timing, the input needs to be present before the precharge becomes present. Therefore, this circuit requires additional timing signals to insure this condition.

A dual output timing circuit is shown in FIG. 2. Note that in addition to the timing requirements of the single branch circuit as shown in FIG. 1, the dual output or dual branch circuit requires a second timing signal. These additional timing requirements can be burdensome when multiple branches are connected together.

It is the object of this invention to provide multiple output logic circuitry with minimal number of clock signals.

SUMMARY OF THE INVENTION

In accordance with the present invention, a dynamic metal oxide semiconductor field effect transistor clocking circuit is provided which produces at least one output at a fixed time interval after an input is received. The clocking circuit consists of two stages, the first stage includes a node to provide a first stage output. The first stage includes circuit capability to charge the node and conditionally discharge the node upon receiving an input. The second stage is connected to the first stage such that the output of the first stage is the input to the second stage. The second stage also includes a node with circuit capability to precharge circuit capability to precharge the node. The second stage also includes circuit capability to discharge the node upon receiving the input from the first stage. The second stage also includes the means to block the discharge of the second node upon sensing a discharge of the first node.

In the preferred embodiment, the clocking circuit consists of two inverter branches. The first inverter branch contains a precharge device serially connected to an isolation device, an input device and a discharge device. This first branch includes a node between the precharge and isolation device. Precharge is accomplished by the precharge device receiving a bootstrapped signal of a voltage greater than the voltage received by the branching circuit from its power supply. This node is also connected to an isolation device to isolate the node from the input. The isolation device is connected to an input device to conditionally discharge the node at a time determined also by the serially connected discharge device. The second stage is connected to the first stage by having the node from the first stage connected to the input of the second stage. The second stage, like the first stage, contains a precharge device connected to a signal that is bootstrapped. Also, the second stage includes an isolation device similar to the first stage. The second stage is different from the first stage in that the output of the second stage being the output from the second stage node. In the preferred embodiment, a fourth device is provided in the second stage which is connected to the clocking circuit power supply and in turn, connected to the discharge device of the first stage. This difference allows elimination of the second discharge clock for the second stage by taking into consideration the threshold voltage required to discharge the node in the second stage through this fourth device in the second stage to the discharge device in the first stage.

DETAILED DESCRIPTION OF THE DRAWINGS

The novel features believed characteristic of this invention are set forth in the claims. The invention itself, however, as well as other features and advantages thereof will be best understood by reference to the detailed description which follow when read in conjunction with the accompanying drawings wherein:

FIG. 1 is a schematic diagram of the prior art in a single stage clocking circuit.

FIG. 2 is a schematic diagram of the prior art two stage clocking circuit.

FIG. 3 is a timing diagram for the clocking circuits in FIG. 1 and FIG. 2.

FIG. 4 is a schematic diagram of the present invention as a two output inverter.

DESCRIPTION OF THE SPECIFIC EMBODIMENT

Figure 5:
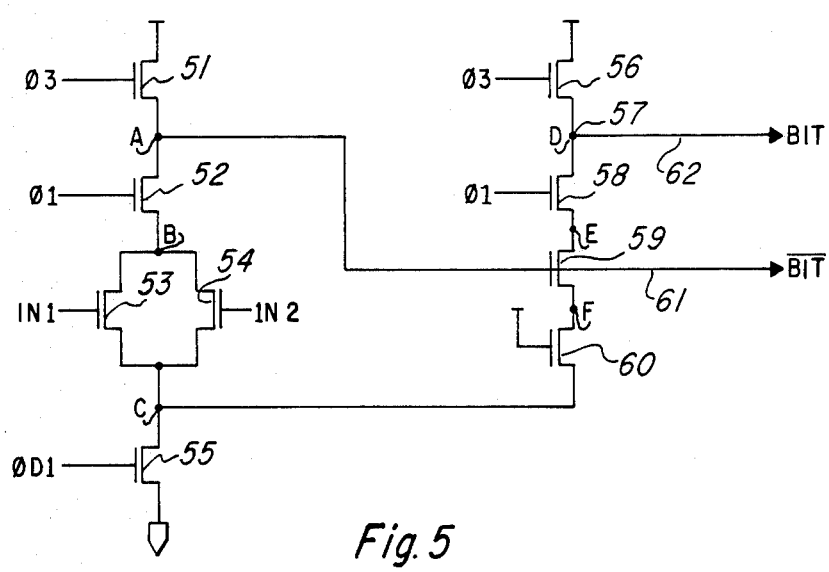
FIG. 5 is a schematic diagram of the present invention as a NOR gate connected to an inverter.

A simple dynamic clocking circuit inverter is illustrated in FIG. 1 as prior art. Note that the circuit receives power from Vcc at point 5. This voltage is switched by $\phi$ 3 in device 6 to precharge a node 7 which also provides the output of this circuit branch. The input for the circuit branch is received by device 9, however, device 9 is isolated from node 7 by device 8 which receives an isolation pulse $\phi$ 1. The input into device 9 will conditionally discharge node 7 upon the occurrence of a timing pulse $\phi$ D1 in device 10. The charge then is coupled through to Vdd at point 11.

A prior art two stage conversion is shown in FIG. 2. Note that the two branches are essentially the same with the exception that the output of the first branch, node 16, is connected to device 22 and output line 25 which is the complement of the output on line 24. The first branch is basically identical to the circuit in FIG. 1. Device 14 is for precharging node 16, device 19 receives the input and is isolated from node 16 by isolation device 18. The circuit is discharged upon the proper occurrence of the input and timing on device 20. The second branch, likewise, contains the node 17 which is precharged by Vcc at point 13 through device 15 receiving the precharge pulse from $\phi$ 3. The input from the first branch on line 25 is received by device 22 which conditionally discharges the node 17 upon the occurrence of the isolation pulse $\phi$ 1 and device 21 and the discharge timing $\phi$ D2 in device 23. Note in FIG. 3 that the precharge timing pulse is bootstrapped or the voltage of the signal φ 3 in device 15 is greater than Vcc. This permits a minimum voltage loss across device 15 and 14 in precharging nodes 17 and 16, respectively. One disadvantage of the prior art is the requirement of the second discharge clock, noting that φ D2 is a pulse width smaller than φ D1 and occurs at the end of the φ D1 pulse. This type of arrangement requires two separate discharge clocks for the circuit to produce the two outputs.

The preferred embodiment is illustrated in FIg. 4. The circuit in FIg. 4 is essentially the same as the circuit in FIG. 2 in terms of signal output. The major difference in the circuit in FIg. 4, however, is that it only requires a single discharge clock, φ D1. The first branch is connected to Vss at point and is basically the same as the branch in FIG. 1. Device 32 provides the precharge to node 34 which is isolated from the input by device 36 and receives the input on device 38 which conditionally discharges the node 34 upon the discharge timing φ D1 on device 43. The second branch connected to Vcc at 31 precharges node 35 at φ 3 through device 33 and device 37 isolates node 35 during φ 1−. Device 39 receives branch input from the previous branch node 34 and outputs line 41. Device 42 is connected to Vcc at point 44 and provides the effective timing to allow both output lines, 40 and 41, to output signals at the same time upon the occurrence of φ D1 in the first branch.

Figure 6:
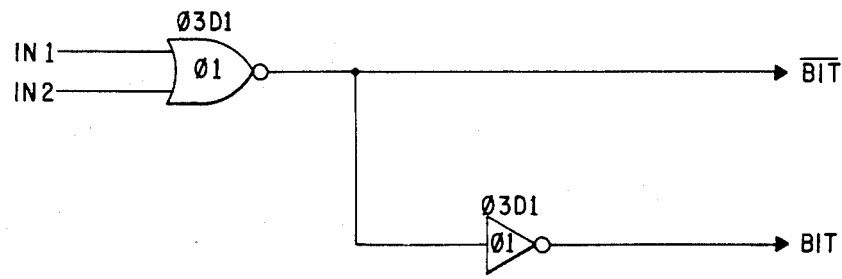
FIG. 6 is a logic schematic diagram of the circuitry in FIG. 5.

An application of this invention is shown in FIG. 5. The logic schematic for the circuit of FIG. 5 is shown in FIG. 6. The circuit is a NOR gate connected with a BIT- output and also an output connected through an inverter to produce BIT output. Thus in FIg. 5 the two inputs are received in the first branch by devices 53 and 54. These inputs conditionally discharge node A that has been precharged by φ 3 through device 51. Device 52 receives the isolation timing φ 1 as previously discussed. Likewise, the node A is discharged through device 55 upon the occurrence of the discharge timing φ D1. Node A provides a input to the second branch into device 59 on line 61 as shown. In addition, line 61 is a BIT output. The second branch precharges node 57 through device 56 upon the occurrence of φ 3. Node 57 provides a BIT output on line 62. Node 57 is isolated from the input on line 61 by device 58 which receives the isolation timing φ 1. Also included in this second stage is device 60 which connected to device Vcc.

Figure 7:
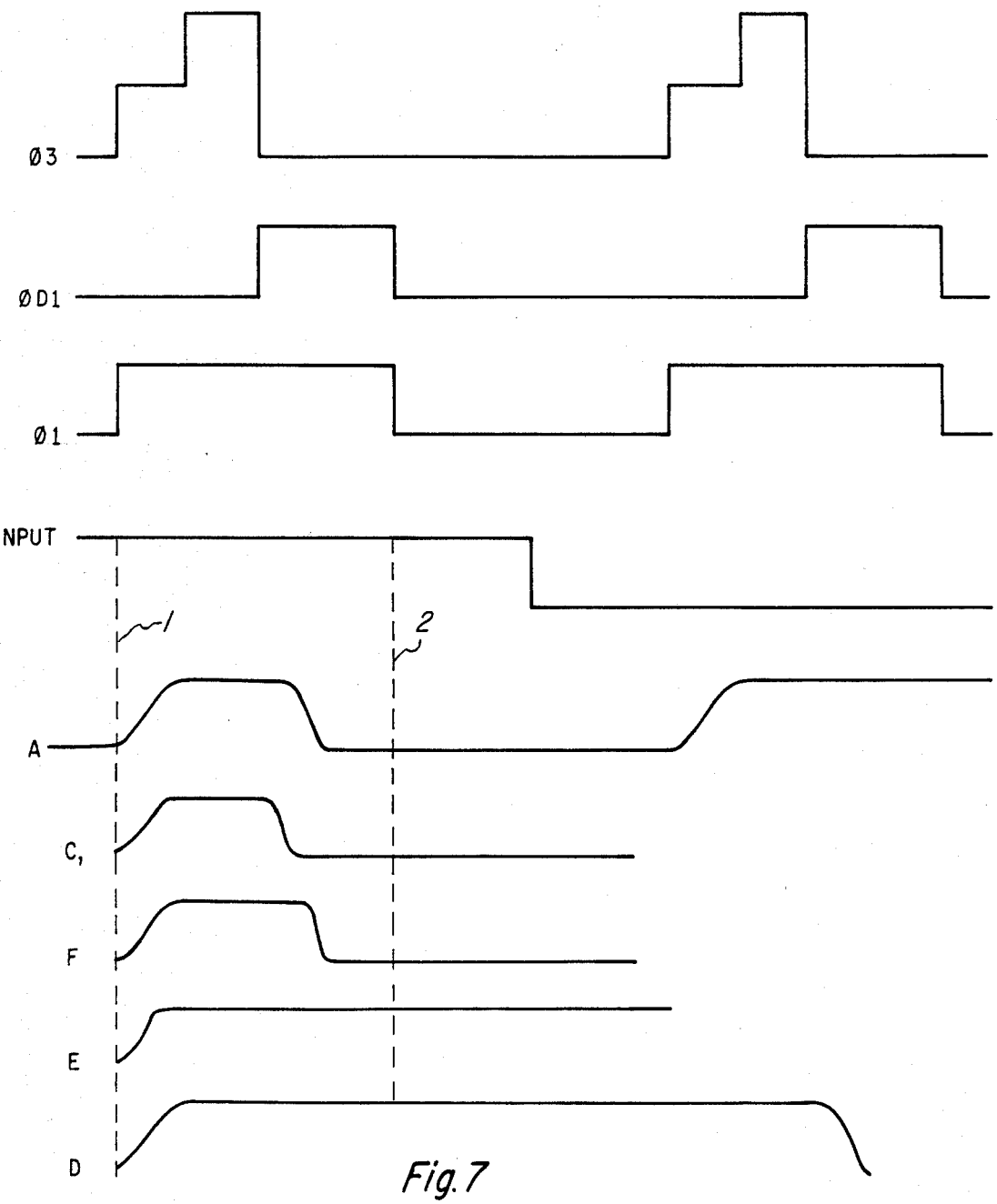
FIG. 7 is a timing diagram for the circuitry in FIG. 5.

The objective of this circuitry in FIG. 5 is to provide a BIT and BIT- output with a single discharge clock, φ D1. The timing of this circuit operation is illustrated in FIG. 7. Note φ 3, φ D1, φ 1 and the input signals are basically the same as the signals in FIG. 3. Nodes A, C, D,E and F are marked in FIG. 5. The voltage at these nodes is illustrated in FIg. 7.

Referring to FIG. 5, the device 60 serves as a barrier to the discharging of node D during φ D1 to insure the validity of the output of line 57. Device 60 has a finite threshold voltage (Vt). The voltage at Node C must be this voltage threshold (Vt) lower than the voltage at Node F in order to discharge Node F through device 60. If one of the inputs are present at devices 53 and 54, device 55 connected to Node C begins discharging Node A and by the time the voltage at Node C drops enough to discharge Node F, Node A has been discharged to the point that device 59 turns off. With device 59 in an "OFF" state, Node D remains charged. Alternatively, if neither inputs are present, then Node A remains charged and Node D is discharged through device 55 during φ 1. The result being that this circuit uses a single discharge clock, φ D1, to produce two output signals.

What we claim is:

1. A dynamic metal oxide semiconductor field effect transistor clocking circuit for providing at least one output clock pulse at a fixed time interval after receiving an input pulse, the clocking circuit comprises:
   a first stage means having a first stage node for providing a first stage output signal at the first stage node and wherein the first stage means includes;
   a first precharge means for precharging the first stage node at a first predetermined time interval;
   an isolation means for isolating the precharged first stage node at a second predetermined time interval;
   input means for receiving an output enable signal to the first stage means, the output enable signal having a first and second logic state;
   discharge means for discharging the first stage node at a third predetermined time interval when the output enable signal is at the first logic state the first precharge means, the first stage node, the isolation means, the input means, and the discharge means being coupled in series, said discharge means being isolated from the first stage node by the isolation means and the input means when the output enable signal is at the second logic state;
   second stage means having a second stage node for providing the output clock pulse at the second stage node and wherein the second stage means ·includes;
   a second precharge means for precharging the second stage node at the first predetermined time intervals;
   a second isolation means for isolating the precharged second stage node at the second predetermined time interval;
   a second input means operably connected to first stage means for receiving the first stage output signal which is representative of the voltage level of the first stage node and having a first output logic state and a second output logic state;
   coupling means for electrically coupling the discharge means to the second stage means for discharging the second stage node when the first stage output signal is at the first output logic state; and
   said coupling means being isolated from the second stage node by the second isolation means and the second input means when the first stage output signal is at the second output logic state.

2. The dynamic metal oxide field effect transistor clocking circuit according to claim 1 wherein the input means further comprises:
   combination circuit means for logically "OR" combining two signals to obtain the output enable signal.

3. The dynamic metal oxide semiconductor field effect transistor clocking circuit according to claim 1 wherein the discharge means comprises:
   a field effect transistor having its drain-source current path connected between the input means and a reference potential and having a gate for receiving a pulse at the third predetermined interval and the coupling means comprises:
   a second field effect transistor having its drain-source current path connected between the junction of the first field transistor and the input means and the second input means, the second field effect transistor having its gate connected to receive a bias voltage.

4. A method of providing an output clock pulse at a fixed time interval after receiving an input pulse in a dynamic metal oxide semiconductor field effect transistor clocking circuit comprising:

providing a first stage output signal with a first stage means that includes the steps of precharging a first stage node with a precharge means:

isolating the precharged first stage node with an isolating means at a second predetermined time interval;

receiving an output enable signal at an input means to the first stage means, the output enable signal having a first and second logic state;

discharging the first stage node at a third predetermined interval with a discharge means when the output enable means signal is at the first logic state;

isolating the discharge means from the first stage node with the isolation means and the input means when the output enable signal is at the second logic state;

providing the output clock pulse with a second stage means at a second stage node with the following steps including:

precharging the second stage node with a second precharge means at the first predetermined time interval;

isolating the precharge second stage node with a second isolating means at the second predetermined time interval;

receiving the first stage output signal with a second input means, the first stage output signal having a first and second output logic state;

electrically coupling with a coupling means the discharge means to the second stage means;

discharging the second stage node when the first stage output signal is at the first output logic state; and isolating the coupling means from the second stage node with the second isolation means and the second input means when the first stage output signal is at the second output logic state.

5. The method according to claim 4 further comprising the steps of logically "OR" combining two signals to obtain the output enable signal.

* * * * *